United States Patent [19]

Pouit et al.

[11] Patent Number: 4,661,820

[45] Date of Patent: Apr. 28, 1987

[54] METHOD AND EQUIPMENT FOR PICKING UP ANTENNA PATTERNS IN NEAR-FIELDS

[76] Inventors: Christian Pouit, 15, rue d'Alsace Lorraine, 31000 Toulouse; René Guern, 24, Rue de Clamart, Boulogne Billancourt, both of France

[21] Appl. No.: 626,983

[22] Filed: Jul. 2, 1984

[30] Foreign Application Priority Data

Jul. 4, 1983 [FR] France ................. 83 11082

[51] Int. Cl.[4] .................. G01S 3/02; H01Q 3/00
[52] U.S. Cl. ..................... 342/351; 342/360
[58] Field of Search ............ 343/360, 351; 455/703, 455/67

[56] References Cited

U.S. PATENT DOCUMENTS

| | | | |
|---|---|---|---|
| 3,662,389 | 5/1972 | Coffin et al. | 343/360 |
| 3,879,733 | 4/1975 | Hansen et al. | 343/360 |
| 4,201,987 | 5/1980 | Tricoles et al. | 455/67 |
| 4,453,164 | 6/1984 | Patton | 343/360 |
| 4,553,145 | 11/1985 | Evans | 343/360 |

Primary Examiner—Theodore M. Blum
Assistant Examiner—David Cain

[57] ABSTRACT

Method and equipment are disclosed for picking up the radiation pattern of an antenna to be tested from measurements in near-field. The antenna to be tested is illuminated by a transmit antenna having wavefronts in the shape of circular cylinders. The radiation pattern of the antenna to be tested then is expressed by an integral transform of a unidimensional function which is solved by computing means.

3 Claims, 4 Drawing Figures

$$\vec{A}(\theta,\bar{\varphi}) = \iint_S \vec{E}(\theta,\varphi)(\vec{n}\cdot\vec{u}) e^{j2\pi\frac{R}{\lambda}\vec{n}\cdot\vec{u}} dS$$

METHOD AND EQUIPMENT FOR PICKING UP ANTENNA PATTERNS IN NEAR-FIELDS

BACKGROUND OF THE INVENTION

1. Field of the Invention

The present invention relates to a method and equipment for picking up antenna radiation patterns in near fields.

It is known that the field radiated over a great distance r by an antenna may be expressed in the following form:

$$E(r, \theta, \Phi) \xrightarrow[r \to \infty]{} \frac{K \exp[-2\pi j(r/\lambda)]}{r} \vec{A}(\theta, \Phi) \quad (1)$$

where r, $\theta$ and $\Phi$ represent the spherical coordinates of a point in space, $\lambda$ the wavelength of the radiation emitted and K a constant. The antenna radiation properties are characterized in amplitude and phase by the function $\vec{A}(\theta, \Phi)$.

Antenna radiation patterns are generally used to indicate the curves representing the spatial distribution of the radiated energy. When the power emitted by the antenna is 1 watt, the radiation pattern is depicted by the function $[\vec{A}(\theta)]^2$ for a given value of $\Phi$ or $[\vec{A}(\Phi)]^2$ for a given value of $\theta$.

As an antenna displays the same directivity properties whether used for transmission or reception, these radiation patterns can be determined experimentally by means of a set-up comprising a transmit antenna generating a radiation wave with spherical wave-fronts, an antenna under test working in the receive mode and receiving the electromagnetic field from the transmit antenna and a device for positioning the antenna under test in this field. Provided that the transmit antenna is located sufficiently far away from the antenna under test, then equation (1) gives a good approximation of the radiated field since the spherical wave fronts can be considered as being planar in the vicinity of the antenna under test.

It is generally accepted that this condition is satisfied when:

$$r \geq 2L^2/\lambda$$

where:
r is the distance between the two antennae,
L is the biggest dimension of the antenna under test, and
$\lambda$ is the wavelength.

For the larger antennae, this means using base-lines of considerable dimensions for measurement purposes. By way of an example, a 10 GHz antenna 3 meters high must be checked out over a measurement base-line at least 600 meters long.

2. Description of the Prior Art

Over recent years, a certain number of new measurement methods have been put forward to determine the radiation patterns under near-field conditions ($r < 2L^2/\lambda$). These methods have brought into play measurement equipment implementing antennae emitting planar waves in the near field, or calcuating means determining an antenna pattern taking into account the sphericity of the waves received by the antenna for which the pattern is being sought.

It has been proposed by the company Scientific Atlanta that direct readings be taken using a transmitting antenna with greater dimensions than the antenna under test. The transmit antenna is of the horn-type placed at the focal point of a large parabolic reflector and throwing radiation thereon. In this instance, the emitted wave is planar and homogeneous at the antenna under test; it were as if the two antennae were very far apart.

The difficulty in this method lies in the manufacture of the transmitting antenna and notably the reflector thereof, in view of the degree of accuracy required. As things stand, this method is costly and does not permit measurement readings for antennae with dimensions in excess of 1.2 meters.

In French patent application FR-A-2434497, the company Plessey describes a variation on this solution in which the large parabolic reflector of the transmitting antenna is replaced by a large lens made of a lightweight polyurethane foam type dielectric material.

This lens is, it would seem, less expensive than the Scientific Atlanta reflector; it does, however, produce a less homogeneous planar wave at the antenna under test and the working pass band is certainly smaller on account of the need to use absorbent linings to prevent reflections on the lens faces. Furthermore, the limits on dimensions are at least restrictive. For an antenna under test with dimensions of 1.2 meters, use must be made of a lens 2 meters in diameter and more than 1.2 meters thick.

Additionally, according to former art, reading can be taken in the near field and be followed by calculations intended for correcting the effects due to curvature of the emitted wavefront at the antenna under test. The detection of a radiation pattern is carried out in two stages that can be recapped in relation to FIGS. 1 and 2.

First stage

Radio-frequency transmitter 1 feeds antenna 2 the radiation from which, in the form of spherical wavefronts, is received by antenna 3 under test set up at a distance R from antenna 2. Antenna 3 is mounted on a positioner 4 that is controlled both is azimuth $\phi$ and elevation $\theta$ by computer 5. The signal received by antenna 3 in its successive positions is detected in amplitude and phase by coherent detector 6. Detector 6 is connected to computer 5 and the latter thus receives signals representing the values of the field $\vec{E}(R, \theta, \phi)$ recorded in terms of the two angles $\theta$ and $\phi$ for a given value of R. The measurements are recorded in digital form and are stored in a two-dimensional table:

$(\vec{E}(\theta_i, \phi_j))$.

Second stage

Calculation of the radiation patterns corrected for near-field effects occurs in the second stage.

It is temporarily assumed that antenna 3 serves as the emitter and antenna 2 serves as the receiver. Transmitter antenna 3 is assumed to be fixed and receiving antenna 2 moves over a sphere with an origin O in azimuth and elevation coordinates.

If the electromagnetic field as radiated at all points on any closed surface around the antenna is known, then it is possible to calcuate the field at any point in space outside this surface using Kirchhoff's equation:

$$\vec{E}(r) = \int_S \vec{E}(r') \frac{\partial G}{\partial n} - G \frac{\partial \vec{E}(r')}{\partial n} ds \quad (2)$$

(Cf. Principles of Optics by Max Born and Emil Wolf, Pergamon Press, 1959, page 376, equation (7)), a similar formula (formula (5)) is given by V. I. TURCHIN et al. in "Antenna Testing Based on Near Field Measurements" Radio Engineering and Electronic Physics, Vol. 24 (1979) Dec., No. 12, Silver Spring, Md., USA, where S is the surface area around the antenna, r and r' are the vectors defining the positions of the points located respectively outside and on the surface S and n is the unit vector normal to S at r'

$$G = \frac{\exp(-jk|r - r'|)}{4\pi|r - r'|}$$

$$k = \frac{2\pi}{\lambda}$$

If $S_1$ is that part of the surface S seen from the point r, when the surface $S_1$ is sufficiently far away from the antenna for the fields on $S_1$ to be represented by a geometrically optical approximation, then Kirchhoff's equation can be reduced to a more simplified form:

$$\dot{E}(r) = \int_{S_1} \dot{E}(r') \frac{\partial G}{\partial n} ds \tag{3}$$

When the surface S is a sphere centered on O and having a radius R and $S_1$ (FIG. 2) is half such sphere and for points r a long way from the antenna (r >> R), Kirchhoff's equation may be written as:

$$\vec{E}(r) \xrightarrow[|r| \to \infty]{} \frac{jk}{4\pi|r|} \int_{S_1} \vec{E}(\theta, \phi)(\vec{n} \cdot \vec{u})\exp[-jkR\vec{n} \cdot \vec{u}]R^2 \sin\theta d\theta d\phi \tag{4}$$

where $\theta$ and $\phi$ are the angles of elevation and azimuth defining a point on the sphere (hence $dS = R^2 \sin\theta d\theta d\phi$, and u is the unit vector of r).

Although equation (4) has been formuated under the assumption that 3 and 2 are the transmitting and receiving antennae respectively and that the former is fixed and the latter movable throughout a sphere of radius R, the same equation holds true when 3 and 2 are respectively receiving and transmitting antennae where the former is movable about a point O and the latter is fixed.

It can be seen that the method employed in former art as just described includes the calcuation by computer of a bidimensional integral transform. This makes it possible to ascertain radiation patterns for very large antennae. However, the greater the antenna, the greater the volume of computer memory space and the longer the computation time. This method is particulaly penalizing when it comes to determining a single pattern of the type $|A(\theta)|^2$ for a set value of $\Phi$ or $|A(\phi)|^2$ for a set value of $\theta$. This is because to calculate the corrections, a determination is required of all the values of the two-dimensional function $\vec{E}(\theta, \phi)$.

SUMMARY OF THE INVENTION

The object of the present invention is to afford a method of measuring antenna patterns for which the bidimensional integral transform the computer is required to solve is replaced by a unidimensional integral transform, where the transmitting antenna that serves in illuminating the antenna under test presents a special structure emitting waves with equi-phase surfaces in the form of cylinders.

BRIEF DESCRIPTION OF THE DRAWINGS

The invention will now be described in detail in relation to the drawings appended hereto in which.

DESCRIPTION OF THE PREFERRED EMBODIMENT

Figure 1:
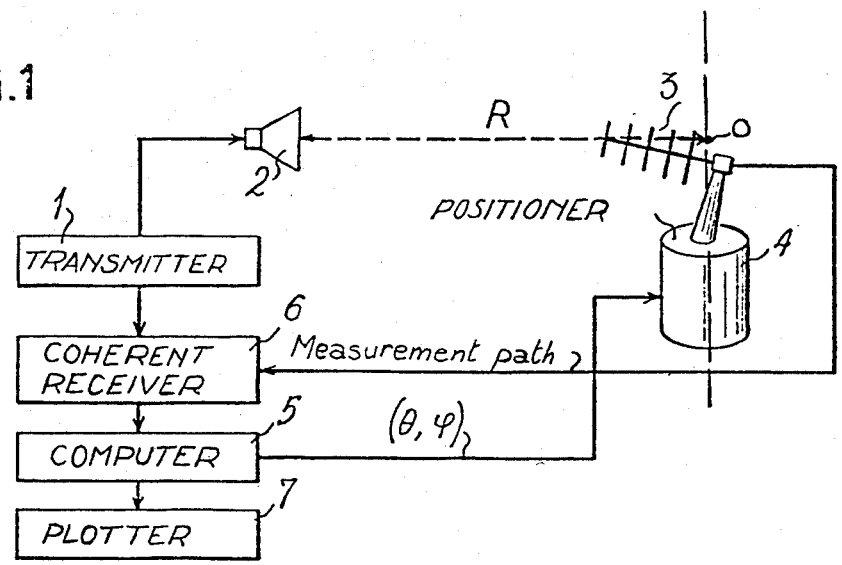
FIG. 1 is a block diagram of the method and equipment for determining antenna patterns as in the former art; this has been discussed in the foregoing.
Figure 2:
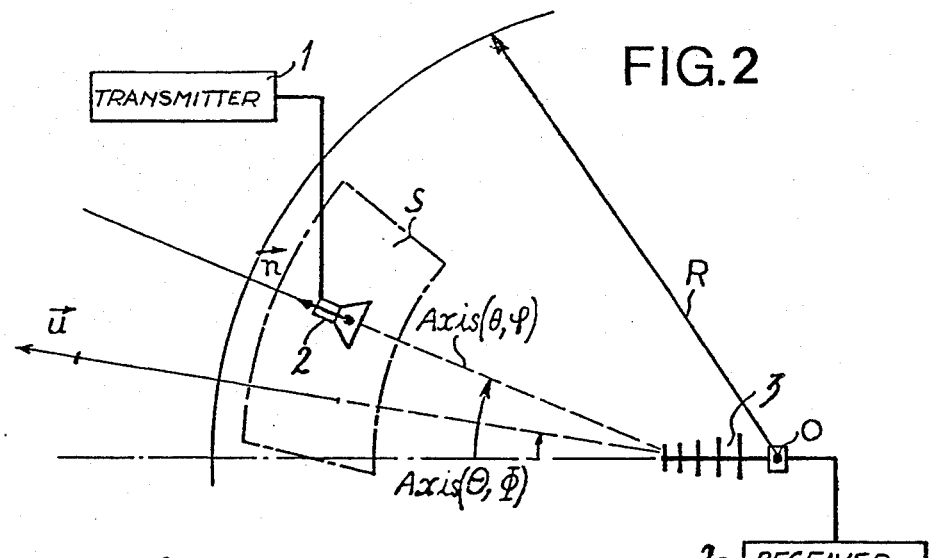
FIG. 2 is a geometrical diagram in relation to the former art as in FIG. 1; this has been discussed in the foregoing.

In FIG. 1, antenna 3 under test was moved in elevation and in azimuth by positioner 4. As the antenna movement is relative, it is equivalent to displace transmitting antenna 2 through a sphere of radius R and keep receiving antenna 3 fixed instead of displacing antenna 3 through a sphere and keeping antenna 2 fixed. In the case of the invention, receiving antenna 13 under test is displaced only angularly in azimuth by positioner 14. An equivalent result is obtained if transmitting antenna 12 is displaced through a circle of radius R about antenna 13 that remains fixed and if antenna 12 works as a receiver and antenna 13 as a transmitter. The sphere of radius R is replaced by a cylinder with a circular cross section of radius R and whose points carry coordinates $\phi$ and z. Kirchhoff's equation (3) is transformed into two integrals in $\phi$ and z as variable.

$$\vec{E}(\Phi) = \frac{jkR}{4\pi|r|} \int_C \vec{\epsilon}(\phi)\cos(\phi - \Phi)\exp[-j2\pi(R/\lambda)\cos(\phi - \Phi)]d\phi \tag{5}$$

$$\vec{\epsilon}(\phi) = \frac{1}{L'} \int_{z=0}^{L'} \vec{E}(\phi, z)dz \tag{6}$$

In both these expressions:

L' is the length of the aperture of the sectoral at horn antenna 12;

$\vec{E}(\phi, z)$ is the field emitted by antenna 13 at any point on the cylinder with a circular cross-section of radius R and whose axis runs through O, $\vec{\epsilon}(\phi)$ represents the total field captured by antenna 12.

The first integral was taken over a semi-circle c and the second over the height L of the cylinder. When antenna 12 includes a reflector in the shape of a parabolic cylinder (FIG. 3), not very high, it provides the integral transform $\vec{\epsilon}(\phi)$ directly in the form of an analog signal by phase summing the fields $\vec{E}(\phi, z)$ over the antenna surface aperture, i.e. approximately a straight-line segment.

The transform (5) takes the form:

$$\vec{A}(\Phi) = \int_{\Phi - \frac{\pi}{2}}^{\Phi + \frac{\pi}{2}} \vec{\epsilon}(\phi)\cos(\Phi - \phi)\exp\left[-j2\pi \frac{R}{\lambda} \cos(\Phi - \phi)\right] d\phi$$

and may be written as:

$$A(\Phi) = \int_{-\pi}^{+\pi} \epsilon(\phi) C(\Phi - \phi) d\phi$$

$\vec{\epsilon}(\phi)$ represents the field measured over antenna 12 and $C(\Phi-\phi)$ the kernel of the integral transform that is dependent on the parameters R and λ, by setting:

$$C(\alpha) = \cos\alpha \cdot e^{-j\frac{2\pi}{\lambda} R \cos\alpha} \text{ pour } \alpha \epsilon \left[-\frac{\pi}{2}, +\frac{\pi}{2}\right]$$

$$C(\alpha) = 0 \text{ pour } \alpha \notin \left[-\frac{\pi}{2}, +\frac{\pi}{2}\right]$$

As the functions $C(\alpha)$ depend solely on the test conditions, it can be seen that $\vec{A}$ is a convolution between $\vec{\epsilon}$ and $C$. The convolution theorem indicates that the Fourier transform of a product of convolution is equal to the product of the Fourier transforms.

$$\vec{A} = \vec{\epsilon} * C$$

whence $$FT[\vec{A}] = FT[\vec{\epsilon}] \times FT[C].$$

The function $C(\alpha)$ is calculated for discrete values separated by $\lambda/2R$ for a sample number $M=4\pi R/\lambda$. The Fourier transform $\xi(u)$ is then calculated for $C(\alpha)$.

$$\xi(u) = FT[C(\alpha)] \quad (7)$$

and then the N first samples are stored for the function $\xi(u)$ with $N=2\pi L/\lambda$ where L is the greatest dimension of the antenna that will be checked over the measurement base.

The Fourier transform of $\vec{\epsilon}(\phi)$ is calculated $$\vec{G}(u) = FT[\vec{\epsilon}(\phi)] \quad (8)$$

then:

$$\vec{\alpha}(u) = \vec{G}(u) \cdot \xi(u) \quad (9)$$

and lastly:

$$\vec{A}(\phi) = FT^{-1}\vec{\alpha}(u) \quad (10)$$

The function $A(\Phi)^2$ calculated on the basis of equation (10) then represents the radiation pattern for the antenna corrected to take into account the near-field effects.

Although equations (5) to (10) have been established by connsidering that antennae 13 and 12 are respectively for transmission and reception and that the first is fixed and the second movable through a cylinder of radius R, these equations hold true when 13 and 12 are respectively reception and transmission antenna and the first rotates on an axis perpendicular to the mean-perpendicular plane of the second antenna that stays fixed.

Figure 3:
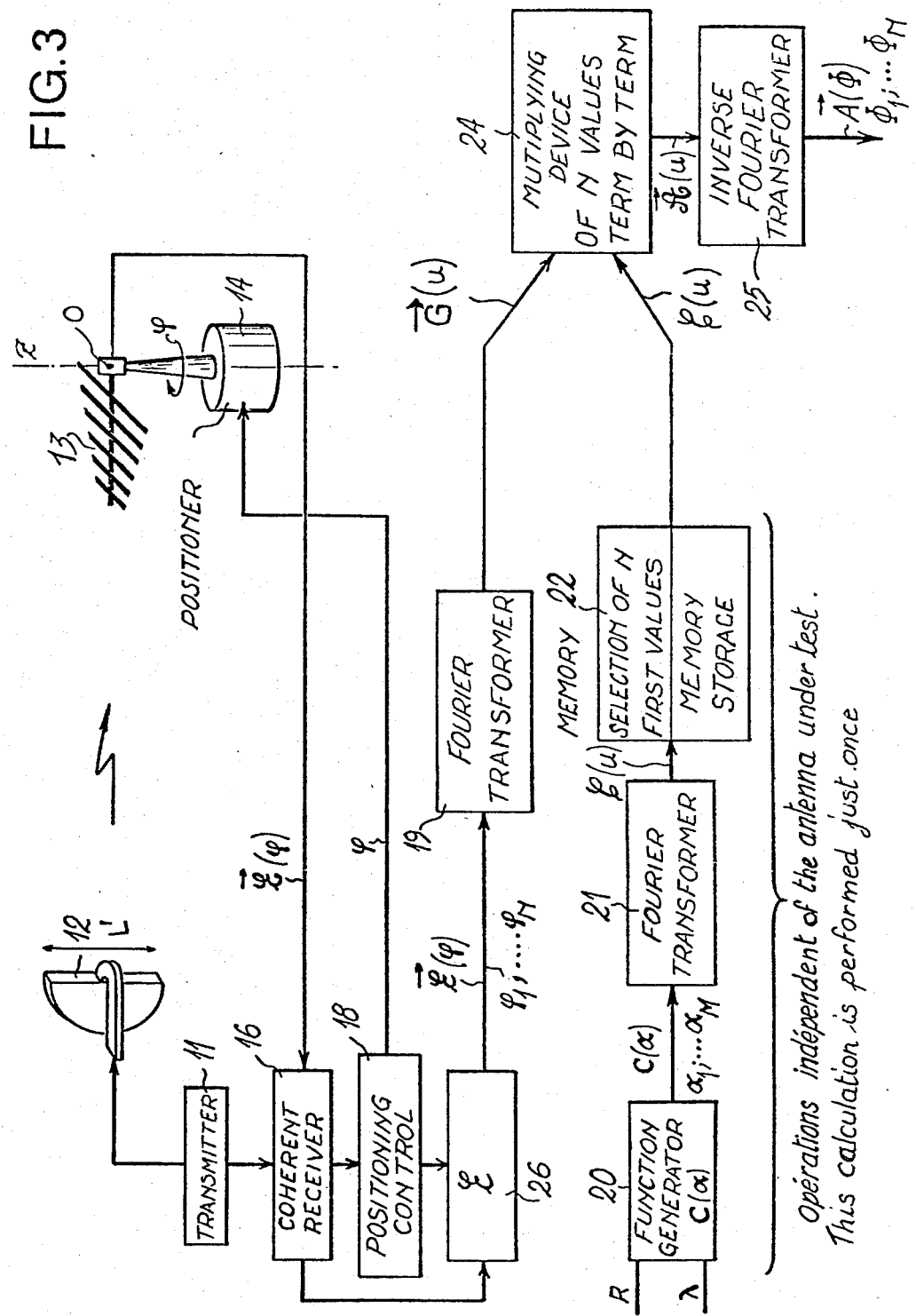
FIG. 3 depicts the method and equipment for determining antenna patterns as in the present invention.

With reference now to FIG. 3, reference number 11 designates a radio-frequency transmitter, 12 a transmit antenna, 13 the receive antenna under test and 14 a positioner. This positioner is controlled by control circuit 18, which imparts rotational movement at constant elevation to antenna 13 about a vertical axis OZ perpendicular to the mean plane of transmit antenna 12, by discrete values of azimuth $\phi$.

Receiver 16 receives the values of $\vec{\epsilon}(\phi)$ for $\phi=\phi_1, \phi_2, \ldots \phi_N$. These values are stored in memory 26 and Fourier transformer 19 performs the Fourier transform (8) and supplies the function $\vec{G}(u)$ for values of $u=u_1, u_2, \ldots u_N$.

Function generator 20 delivers the values of the function $C(\alpha)$ for the values of $\alpha=\alpha_1, \alpha_2, \ldots \alpha_M$ and Fourier transformer 21 delivers the function $\xi(u)$ for the values $u_1, u_2, \ldots u_M$ (equation (7)). The N first values of $\xi(u)$ are stored in memory 22.

Multiplying circuit 24 generates the products $\vec{G}(u) \times \xi(u)$ (equation (9)) and supplies the function $\vec{\alpha}(u)$. Lastly, inverse Fourier transformer 25 provides the function $A(\Phi)$ for the values $\Phi_1, \Phi_2, \ldots \Phi_N$.

Figure 4:
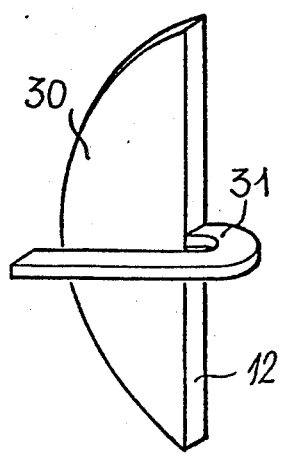
FIG. 4 depicts the transmitting antenna in the antenna pattern detecting equipment as in the invention.

FIG. 4 depicts transmit antenna 12 of the pill-box type whereby $\vec{\epsilon}(\phi)$ can be obtained directly from E($\phi$, z) (equation (6)). It emits a narrow beam of waves characterized in that the equi-phase surfaces at the antenna under test are cylindrical in shape. Antenna 12 comprises a reflector that has the form of a parabolic cylinder 30 fed by a wave guide 31.

It was assumed when describing FIG. 3 that the axis of the cylinder was vertical and that the angle of rotation of antenna 13 was the angle of azimuth. The antenna could also be made to rotate through $\theta$ about the same axis to determine the function $\vec{A}(\theta)$.

What we claim is:

1. A method for determining the radiation pattern of a test antenna based on near field measurements and on near-to-far field conversion calculations, comprising the steps of
   (a) rotating the test antenna about a rotation axis;
   (b) positioning the test antenna at discrete angular positions about said rotation axis;
   (c) illuminating the test antenna with a transmit antenna, said transmit antenna being arranged sufficiently close to the test antenna, whereby a planar wavefront for the wave transmitted by said transmit antenna is prevented at the location of the test antenna, said transmit antenna having a radiation pattern in the shape of a circular cylinder with the direction of the generating line of the cylinder being parallel to said rotation axis;
   (d) storing sample signals received by the test antenna at each angular position thereof, whereby the radiation pattern of the test antenna is a Fourier integral transform of the function formed by said sample signals, said function being multiplied by a kernel function;
   (e) transforming said sample signals by Fourier transform, thereby to obtain Fourier transformed sample signals;
   (f) generating samples of said kernel function;
   (g) transforming said kernel function samples by Fourier transform, thereby to obtain Fourier transformed kernel samples;
   (h) multiplying said Fourier transformed sample signals by said Fourier transformed kernel samples on a term by term basis, thereby to obtain multiplied samples; and
   (i) transforming said multiplied samples by inverse Fourier transforms.

2. Apparatus for determining the radiation pattern of a test antenna based on near field measurements and on near-to-far field conversion calculations, comprising:

(a) means for rotating the test antenna about a rotation axis and for positioning the test antenna at discrete angular positions about said rotation axis;

(b) means for illuminating the test antenna by a transmit antenna, said transmit antenna being arranged sufficiently close to the test antenna, whereby a planar wavefront for the wave transmitted by said transmit antenna is prevented at the location of the test antenna, said transmit antenna having a radiation pattern in the shape of a circular cylinder with the direction of the generating line of the cylinder being parallel to said rotation axis;

(c) means for storing sample signals received by the test antenna at every angular position thereof, whereby the radiation pattern of the test antenna is a Fourier integral transform of the function formed by said sample signals, said function being multiplied by a kernel function;

(d) means for transforming said sample signals by Fourier transforms, thereby to obtain Fourier transformed sample signals;

(e) means for generating samples of said kernel function;

(f) means for transforming said kernel function samples by Fourier transform, thereby to obtain Fourier transformed kernel samples;

(g) means for multiplying the Fourier transformed sample signals by the Fourier transformed kernel samples on a term-by-term basis, thereby to obtain multiplied samples; and (h) means for transforming said multiplied samples by inverse Fourier transform.

3. A device for determining the radiation pattern of a test antenna according to claim 2, wherein said transmit antenna having a radiation pattern in the shape of a circular cylinder is formed by two parallel metal flanges and a metal reflector in the shape of a parabolic cylinder, said transmit antenna having an open-end in the shape of a flat rectangle and feed means at the center of said rectangle.

* * * * *